United States Patent
Tamura et al.

(10) Patent No.: US 6,611,000 B2
(45) Date of Patent: Aug. 26, 2003

(54) LIGHTING DEVICE

(75) Inventors: Tetsushi Tamura, Takatsuki (JP); Hideo Nagai, Takatsuki (JP); Nobuyuki Matsui, Uji (JP); Masanori Shimizu, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/096,806

(22) Filed: Mar. 12, 2002

(65) Prior Publication Data

US 2002/0130326 A1 Sep. 19, 2002

(30) Foreign Application Priority Data

Mar. 14, 2001 (JP) ........................................ 2001-072694

(51) Int. Cl.[7] .............................................. H01L 29/26
(52) U.S. Cl. ............................ 257/80; 257/82; 257/88; 257/98; 257/99
(58) Field of Search .............................. 257/80, 81, 82, 257/83, 88, 89, 98, 99, 100; 313/500, 505, 506, 512; 316/169.1, 169.2, 169.3, 169.4

(56) References Cited

U.S. PATENT DOCUMENTS

| 4,935,665 A | | 6/1990 | Murata |
| 5,831,693 A | * | 11/1998 | McCartney, Jr. et al. ..... 349/42 |
| 5,836,676 A | * | 11/1998 | Ando et al. .................. 362/244 |
| 5,998,925 A | | 12/1999 | Shimizu et al. |
| 6,069,676 A | | 5/2000 | Yuyama |
| 6,320,325 B1 | * | 11/2001 | Cok et al. ................. 315/169.3 |
| 6,469,808 B1 | * | 10/2002 | Onishi et al. ............... 358/475 |
| 6,521,879 B1 | * | 2/2003 | Rand et al. .................. 250/205 |
| 6,549,179 B2 | * | 4/2003 | Youngquist et al. .......... 345/39 |

FOREIGN PATENT DOCUMENTS

| EP | 921568 A | 6/1999 |
| JP | 10-49074 A | 2/1998 |
| JP | 11-163412 A | 6/1999 |
| JP | 2000-208815 A | 7/2000 |

* cited by examiner

Primary Examiner—Sara Crane
(74) Attorney, Agent, or Firm—Merchant & Gould P.C.

(57) ABSTRACT

A lighting device includes: a plurality of LEDs arranged in an at least two-dimensionally dispersed manner; a transparent resin layer that covers the plurality of LEDs in an integrated form; a photo-detecting unit that detects an intensity of light emitted from the plurality of LEDs using a photodetector, the photodetector being arranged inside, on a surface, or in the vicinity of the transparent resin layer; and a power supply circuit unit that controls driving of the plurality of LEDs based on a detection output from the photo-detecting unit. Here, the number of the photodetector is smaller than the number of the LEDs, and the photodetector detects an intensity of light emitted from the LEDs and propagated through the transparent resin layer.

10 Claims, 7 Drawing Sheets

LIGHTING DEVICE

BACKGROUND OF THE INVENTION

1. Field of the Invention

The present invention generally relates to a lighting device including a plurality of light-emitting diodes (hereafter abbreviated as "LED").

2. Related Background Art

As compared with conventional light sources such as a filament lamp and a halogen lamp, LEDs have the advantage of high reliability and long life. Further, since the luminous efficiency of LEDs has been improved recently, LEDs are expected to be used as alternatives for these conventional light sources.

LEDs emit light of only specific wavelengths because of their light-emitting principle. Therefore, in order to obtain white light using LEDs, an LED emitting blue light has to be combined with a phosphor which can be stimulated by the light emission of the LED to emit yellow-green light, as described in JP 2000-208815A. Alternatively, as described in JP11(1999)163412A, a plurality of LEDs that emit colored lights such as red, blue, and green lights have to be combined with one another.

However, the former method employing a phosphor has the following problems. That is, wavelength conversion necessarily degrades the luminous efficiency. Accordingly, this method is not preferable in terms of efficiency. In addition, since a color of emitted light (hereafter called "luminescent color") is uniquely determined depending on the combination of wavelengths of light emitted from the LED and the phosphor, it is impossible to control the color. Thus, if there is a change from the initial color tone due to degradation of the phosphor or the like, the color tone cannot be corrected. Further, since the film thickness of the phosphor, the output power and the wavelength of emitted light from the LED vary to some extent in the manufacturing process, it is difficult to make the luminescent color constant.

With the latter method using LEDs having a plurality of luminescent colors, higher luminous efficiency can be realized and the luminescent color can be controlled. However, since the LEDs for different colors are made of different compositions or different materials, the temperature dependence of their output powers and the deterioration rates are different from one another. As a result, the color tone would change depending on the operating conditions.

JP 10(1998)-49074A describes the method for coping with the problems as above, where LEDs are used as a light source for a backlight in a color display device. More specifically, an optical sensor is used for detecting the luminance level of each colored light emitted from the LEDs, so that each luminance level can be controlled in response to the value detected by the optical sensor, which allows a constant luminescent color to be produced.

However, this method is easily applicable to devices such as a color display device whose light quantity is relatively small, but cannot be applied simply to devices such as a lighting device to which the present invention relates. This is because lighting devices require more LEDs than color display devices and so require a structure capable of outputting a detection result incorporating light emitted from a number of LEDs so as to adequately drive the LEDs.

A higher degree of detection accuracy can be obtained by providing each LED with an optical sensor. But, such a construction is impractical, because it makes the device large and the cost expensive. To cope with this problem, the above-mentioned JP 10(1998)-49074A describes one optical sensor that is shared among different luminescent colors. However, this method does not provide a construction suitable for outputting a detection result incorporating all of the light emitted from a number of LEDs, in the case where the LEDs are arranged in a dispersed manner as in the light source for a lighting device.

SUMMARY OF THE INVENTION

Therefore, with the foregoing in mind, it is an object of the present invention to provide a lighting device where a small number of photodetectors detect the light intensity incorporating light emitted from a plurality of LEDs and the driving of each LED is controlled based on the detected signals, so that even in the case where each LED has different light-emission characteristics, a predetermined light-emission state can be obtained.

The lighting device according to the present invention includes: a plurality of LEDs that are arranged in an at least two-dimensionally dispersed manner; a transparent resin layer that covers the plurality of LEDs in an integrated form; a photo-detecting unit using a photodetector that detects an intensity of light emitted from the plurality of LEDs, the photodetector being arranged inside, on a surface, or in the vicinity of the transparent resin layer; and a power supply circuit unit that controls the driving of the plurality of LEDs based on a detection output from the photo-detecting unit. Here, the number of the photodetectors is smaller than the number of the LEDs, and the photodetector detects an intensity of light emitted from the LEDs and propagated through the transparent resin layer.

With this construction, light emitted from the plurality of LEDs is propagated through the transparent resin layer and detected by the photodetector. Consequently, even with a number of LEDs, this enables the photodetector smaller in number to perform detection incorporating light emitted from the LEDs. Therefore, optical output from the device can be kept constant for a long time.

In the aforementioned construction, the plurality of LEDs may be mounted on a surface of a substrate by bare-chip mounting, and the plurality of LEDs and the substrate may be covered with the transparent resin layer.

In addition, in the above construction, preferably, when the top surface of the substrate and the surface of the transparent resin layer are approximately parallel with each other, a thickness h of the transparent resin layer satisfies:

$h > d/(2 \times \tan(\arcsin(1/n)))$, where d and n represent a maximum distance between two LEDs out of the plurality of LEDs and a refractive index of the transparent resin layer, respectively.

This relationship prevents the light emitted from one of the LEDs from being incident on another LED and absorbed therein. As a result, the efficiency of outputting the light from the device can be improved, while the amount of light incident upon the photodetector can be increased.

The lighting device further may include: a recess formed on the surface of the substrate; and a metal film applied over the surface of the substrate. Here, the walls of the recess may be inclined so as to form a reflector made of the metal film, the plurality of LEDs may be mounted on a bottom of the recess, and the substrate including the recess may be covered with the transparent resin layer.

In addition, in the aforementioned construction, the LEDs may be composed of a plurality of groups of LEDs, the groups emitting different colors of lights, the photo-detecting unit may detect an intensity of light emitted from the LEDs as to each color, and the control circuit may control the driving of the LEDs so that the LEDs have a predetermined balance of light intensities of the colors according to an output detected as to each color by the photo-detecting unit.

In the above construction, the photo-detecting unit may include a photo-detecting device for each color, a sensitivity to light of the photo-detecting device conforming with a peak wavelength of a corresponding color of light. With this construction, the light intensity of each group of LEDs (i.e., for each color) can be detected.

Further, in the above construction, the plurality of LEDs may be turned on sequentially by color, and the photo-detecting unit includes a photodetector smaller in number than the colors of lights, the photodetector detecting light in synchronization with the sequential lighting timings, so that the photodetector is shared in detecting the plurality of colors of lights. In this construction, by turning on the LEDs sequentially by the group (i.e., by color), for example, in the order of red, green, and blue, and monitoring the output voltage from the photo-detecting device with the same timing, the intensity ratio of one color to another color can be obtained. Then, the driving of the LEDs is controlled so as to keep the ratio at the predetermined value, whereby a desired color tone and a constant light intensity can be obtained.

In addition, in the above construction, a distance between two LEDs among those emitting the same color of light and concurrently turned on preferably is set longer than a distance between adjacent LEDs in an array of the plurality of LEDs. When emitting light, the LEDs also generate heat. Therefore, by making the distance between the LEDs concurrently turned on longer, the thermal influence of one LED upon another can be reduced, and so heat generated when mounting a plurality of LEDs as a package can be decreased.

In the aforementioned construction, an antireflective coating preferably is applied over the surface of the transparent resin layer. The antireflective coating made of $MgF_2$ or the like allows the light propagated inside of the resin to be effectively taken to the outside.

Further, in the aforementioned construction, preferably, the photodetector and the plurality of LEDs that are incorporated integrally in the transparent resin layer and the power supply circuit are mounted on a same substrate. By mounting the light source unit and the circuit part that controls the light source unit on the same substrate, it is possible to provide the lighting device in an integrated, miniaturized, and thinner configuration.

DETAILED DESCRIPTION OF THE INVENTION

The following describes embodiments of the present invention, with reference to the drawings.

Figure 1:
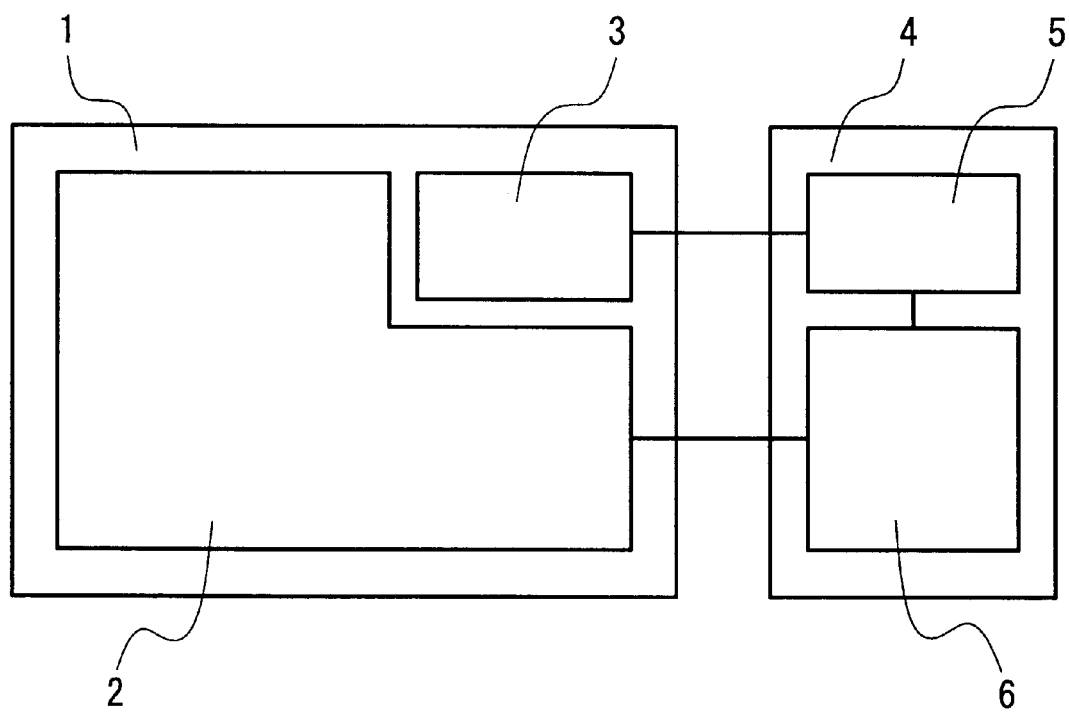
FIG. 1 is a block diagram showing a schematic construction of a lighting device according to the invention.

FIG. 1 shows a basic construction of a lighting device according to the embodiments of the present invention, in which a plurality of LEDs and a photodetector are combined. An LED light source unit 1 includes a light-emitting surface 2 on which the plurality of LEDs are arranged and a photo-detecting unit 3. A power supply circuit unit 4 is made up of a control circuit 5 and a driving circuit 6. These elements can be formed either on the same substrate or on separated locations. In the latter case, the elements can be connected with one another via wiring. The photo-detecting unit 3 may include a photodiode, for example, as the photodetector. The photo-detecting unit 3 detects an optical output from the light-emitting surface 2. Then, the detection output is fed to the control circuit 5. In the case where the optical output from the light-emitting surface 2 is larger than a predetermined value, the control circuit 5 reduces an output power from the driving circuit 6 so as to decrease the optical output from the light-emitting surface 2. Conversely, in the case where the optical output from the light-emitting surface 2 is smaller than the predetermined value, the control circuit 5 performs the reverse of the above procedure.

Thus, the optical output from the LEDs is detected by the photo-detecting unit 3 including a photodiode or the like and the driving circuit 6 is feed-back controlled according to the detection result. Thereby, even if the LEDs deteriorate or their temperature characteristics become different from one another, the emitted light intensity can be maintained. Further, in the case where LEDs emitting different colors of light are used, the light intensity ratio of one color to another color can be maintained, and the required luminescent color can be produced.

Furthermore, even when using LEDs that exhibit variations in color and light intensity, the above control enables required luminescent color to be produced. Therefore, there is no need to screen the LEDs beforehand.

The following describes each of the embodiments in detail.

First Embodiment

Figure 2A:
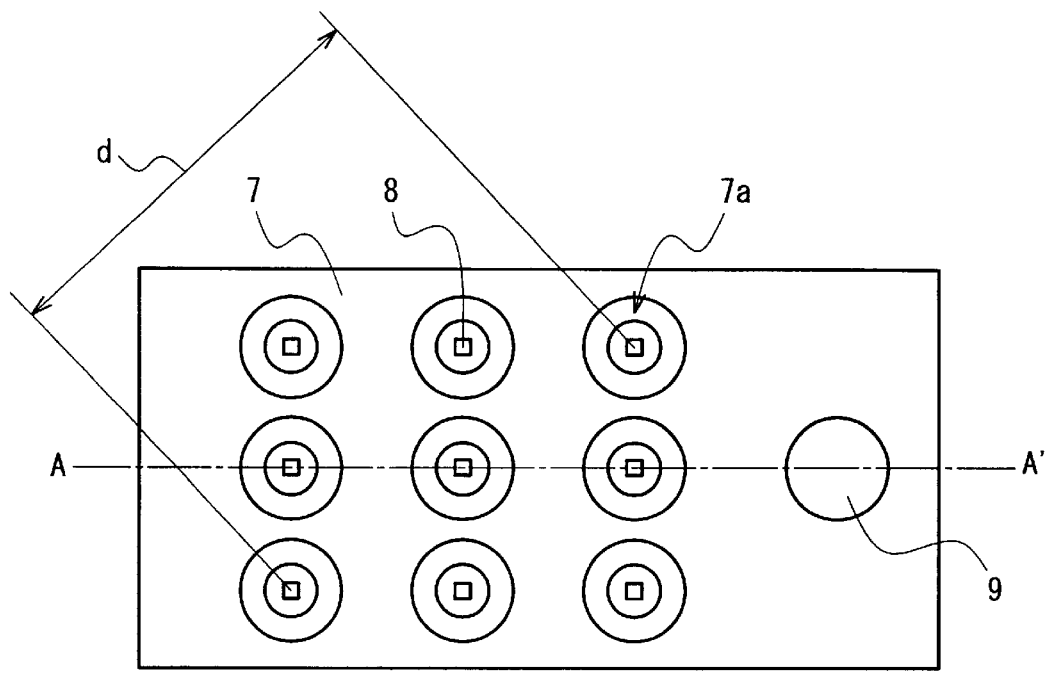
FIG. 2A is a plan view of an LED light source unit in a lighting device according to the first embodiment.
Figure 2B:
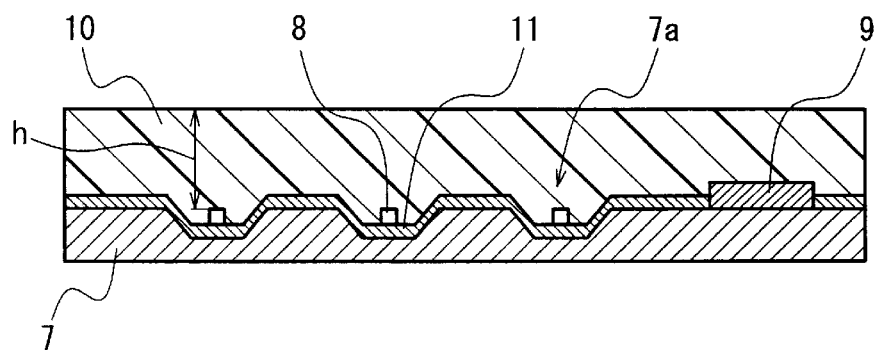
FIG. 2B is a cross-sectional view of the LED light source unit shown in FIG. 2A.

FIG. 2A is a plan view of an LED light source unit according to the first embodiment of the present invention. FIG. 2B is a cross-sectional view taken along the line A–A' in FIG. 2A. In the LED light source unit, a plurality of LEDs 8 emitting a single color of light and one photodetector 9 are mounted on a substrate 7. The LEDs and the photodetector 9 are covered with a transparent resin layer 10 so as to be integrated into one body. Since the photodetector 9 detects light propagated through the transparent resin layer 10, only one photodetector suffices with respect to a plurality of the LEDs to detect the intensity of the light emitted from the LEDs 8 adequately.

The substrate 7 preferably is made of metal so as to diffuse and dissipate heat generated by the LEDs 8 effectively. Alternatively, the substrate 7 may be made of epoxy resin or may be a composite substrate made of epoxy resin mixed with alumina. A recess 7a is formed on the substrate 7, and each of the LEDs 8 is mounted on a bottom face of the recess 7a by bare-chip mounting. Inclined surfaces and the bottom face of the recess 7a are coated with metal plating 11, which allows the light from the LEDs 8 to be radiated forward effectively. A top face of the substrate 7 also is coated with the metal plating 11, which causes the light reflected inward from the transparent resin layer 10 to be redirected to the outside of the device, so that the efficiency of outputting the light of the LEDs 8 from the device can be improved.

The transparent resin layer 10 preferably is made of acrylic resin or epoxy resin having a low thermal expansion coefficient. In the case where the deterioration of resin particularly is significant because a large amount of heat is generated by the LEDs 8, the transparent resin layer 10 preferably is made of silicone resin. Such a transparent resin layer can be shaped so as to double as a lens. Alternatively, the LEDs 8 may be mounted in the commonly used shell-type form or surface-mounted form instead of the barechip-mounted form and may be covered with the transparent resin layer 10.

As stated above, the plurality of LEDs 8 are sealed with the same continuous transparent resin layer 10, whereby the light emitted from all of the plurality of LEDs 8 can be propagated through the resin layer and incident on the photodetector 9. Accordingly, a detection result incorporating light emitted from all of the LEDs 8 can be obtained by the photodetector 9, which is smaller in number than the LEDs 8.

In order to make full use of the above-stated capability, it is desirable to select the optimal thickness of the transparent resin layer 10. For instance, if the top face of the substrate 7 and the surface of the transparent resin layer 10 are approximately parallel with each other, the thickness h (see FIG. 2B) of the transparent resin layer 10 may be set so as to satisfy the condition expressed as the following inequality (1). In this inequality, d and n represent the maximum distance between two LEDs 8 (see FIG. 2A) and a refractive index of the transparent resin layer 10, respectively.

$$h > d/(2 \times \tan(\arcsin(1/n))) \quad (1)$$

This relationship prevents the light emitted from one of the LEDs 8 from being incident on another LED 8 and absorbed therein. As a result, the efficiency of outputting the light from the device can be improved, while the amount of light incident upon the photodetector 9 can be increased.

As another construction of the device, a silicon substrate may be used as the substrate 7, and the LEDs 8 may be mounted thereon by bare-chip mounting. Then, a photodiode as the photodetector 9 may be integrally provided in the silicone substrate like a laser diode unit. This construction can miniaturize the module, simplifies the construction, and reduces the device cost, because the number of assembly steps and the elements can be reduced.

In this embodiment, the plurality of LEDs 8 are mounted on the substrate 7 so as to be arranged on a plane (i.e., two-dimensionally) in a dispersed manner. This form can make the device thinner, and so is the most preferable for lighting devices. However, the present invention naturally is applicable to the other forms. That is, even if the plurality of LEDs is arranged three-dimensionally to some extent, the effects achieved by detecting the light propagated through the transparent resin layer 10 can be obtained.

The module described above is an example of a module constructed so as to emit single color of light with use of LEDs 8 that emit a single color of light. Therefore, a plurality of such modules that emit different luminescent colors, respectively, may be prepared and the plurality of modules may be combined appropriately, whereby a lighting device emitting white light can be realized. In such a case, control is performed by inputting output from a photodetector 9 included in each module into the control circuit 5 shown in FIG. 1.

Alternatively, in the above-stated construction, a plurality of LEDs 8 that emit different luminescent colors may be used. In this case, control can be performed as in the third embodiment described later.

Second Embodiment

Figure 3A:
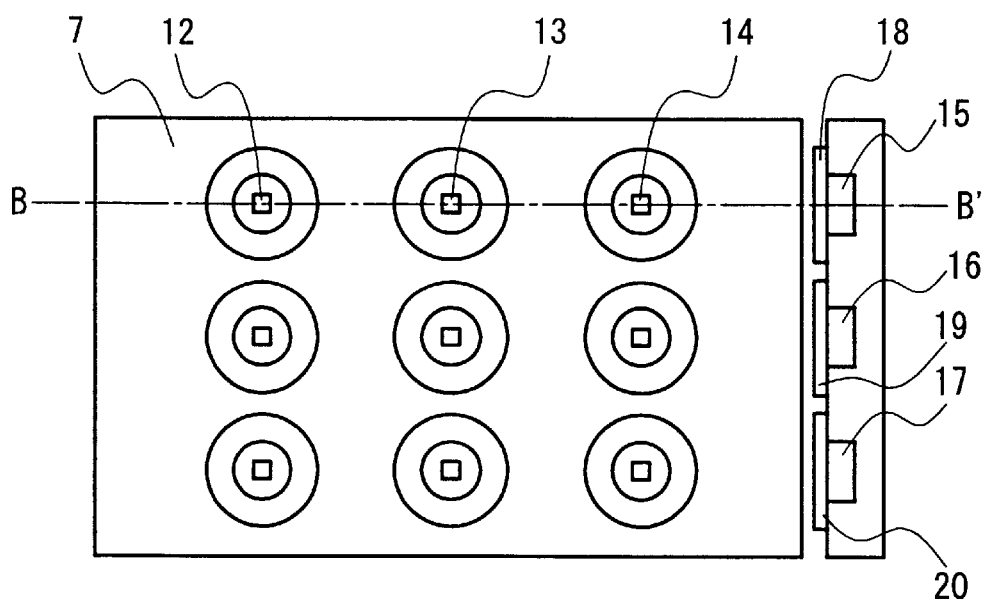
FIG. 3A is a plan view of an LED light source unit in a lighting device according to the second embodiment.
Figure 3B:
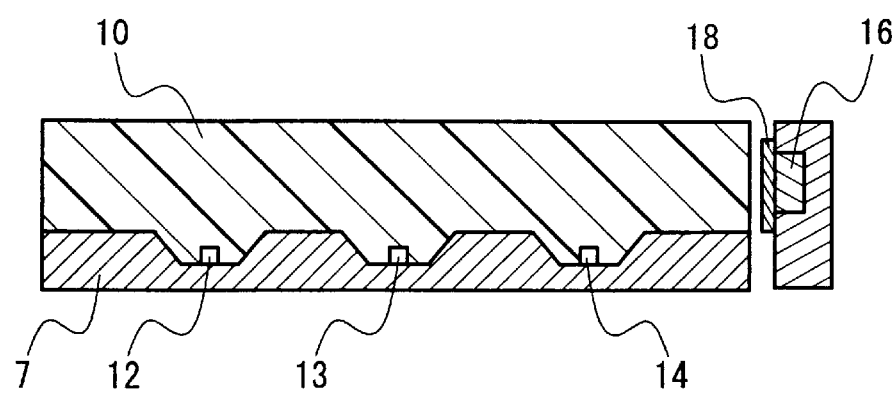
FIG. 3B is a cross-sectional view of the LED light source unit shown in FIG. 3A.

FIG. 3A is a plan view of an LED light source unit according to the second embodiment of the present invention. FIG. 3B is a cross-sectional view taken along the line B–B' in FIG. 3A. In this LED light source unit, LEDs 12 to 14 that emit red, green, and blue light, respectively, are mounted on the substrate 7. These elements are covered with the transparent resin layer 10. At one end portion of the transparent resin layer 10, photodetectors 15 to 17 for each color are provided.

The photodetectors 15 to 17 are provided with spectral filters 18 to 20, respectively. These spectral filters 18 to 20 allow lights in the wavelength ranges corresponding to those emitted from the LEDs 12 to 14, respectively, to pass through, so that a photo-detecting device that deals with the respective luminescent colors is provided. With this construction, the photodetectors 15 to 17 measure the intensity distribution of the light propagated through the transparent resin layer 10 in the respective wavelength region specific to the corresponding color. Preferably, the spectral filters 18 to 20 are each constructed so that their sensitivity to light conforms with the peak wavelength of corresponding color of light.

Then, an operation of each driving circuit for the LEDs 12 to 14 is feed-back controlled by the control circuit so that the intensity of the light obtained from the photodetectors 15 to 17 and the light intensity ratio of one color to another color remain at predetermined values.

Note here that the photodetectors 15 to 17 may be embedded in the transparent resin layer in the same manner as the photodetector 9 of FIG. 2.

Third Embodiment

Figure 4A:
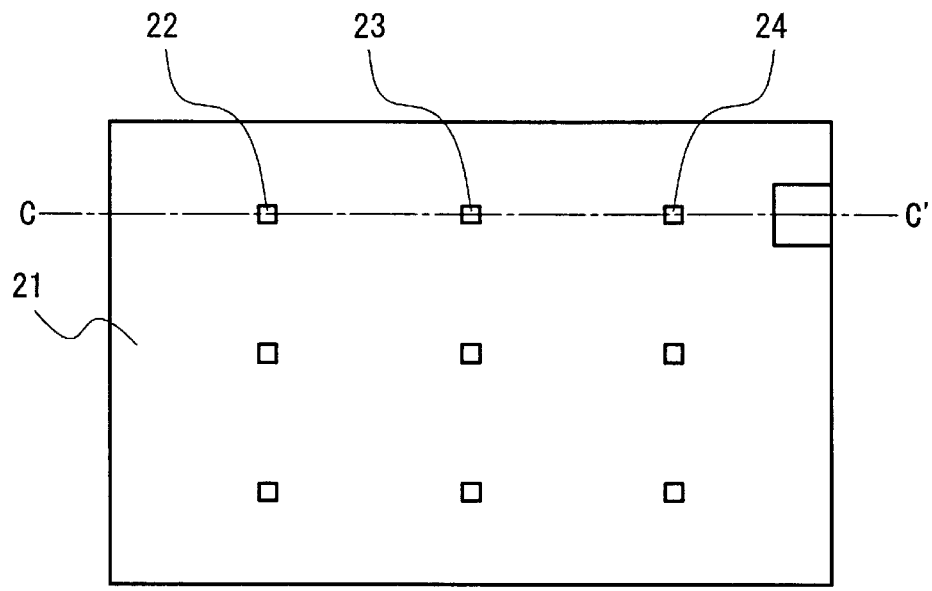
FIG. 4A is a plan view of an LED light source unit in a lighting device according to the third embodiment.
Figure 4B:
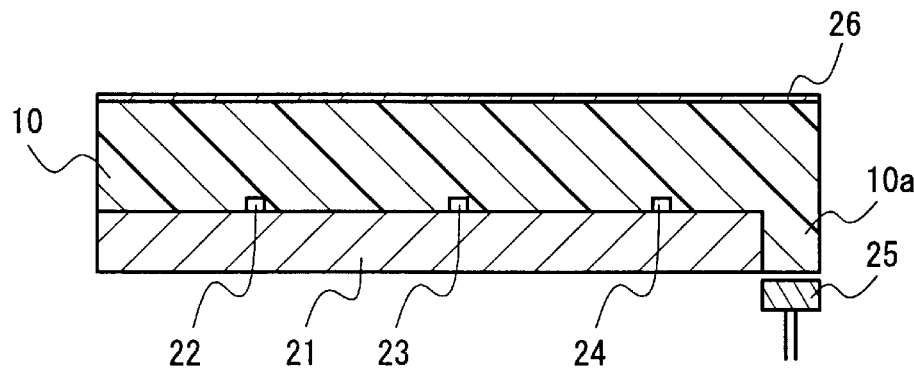
FIG. 4B is a cross-sectional view of the LED light source unit shown in FIG. 4A.

FIG. 4A is a plan view of an LED light source unit of the lighting device according to the third embodiment of the present invention. FIG. 4B is a cross-sectional view taken along the line C–C' in FIG. 4A. According to this embodiment, LEDs for respective luminescent colors are sequentially turned on by applying pulse voltage, so that a photodetector smaller in number than the colors can detect the intensities of multiple colors of light emitted from the LEDs.

As shown in FIGS. 4A and 4B, the LED light source unit includes LEDs 22 to 24, which emit red, green, and blue light, respectively. These LEDs 22 to 24 are covered with the transparent resin layer 10. The transparent resin layer 10 includes an optical waveguide unit 10a that extends from one side of the substrate 21 to the back portion of the substrate 21. In the vicinity of the backside of the substrate 21, a photodetector 25 is placed so as to face the end portion on the side of substrate 21 of the optical waveguide unit 10a. With this construction, the lights emitted from the LEDs 22 to 24 are propagated through the transparent resin layer 10, and then guided to the photodetector 25 via the optical waveguide unit 10a.

The LEDs 22 to 24 for different colors are turned on with respective timings different from one another. Thereby, the photodetector 25 sequentially can detect the light intensity for each color. This allows only one photodetector to be provided with respect to the LEDs emitting three colors of light.

Over the surface of the transparent resin layer 10, an antireflective coating 26 is applied. The antireflective coating 26 preferably is made of $MgF_2$, $TiO_2$, $SiO_2$, $CeO_2$, $CeF_3$, ZnS, $ZrO_2$, etc., because these materials are easy to evaporate and mechanically stable and strong. Such a coating reduces the tendency for the light emitted from the LEDs 22 to 24 and propagated through the inside of the unit to be reflected toward the inside from the interface with air.

Figure 4C:
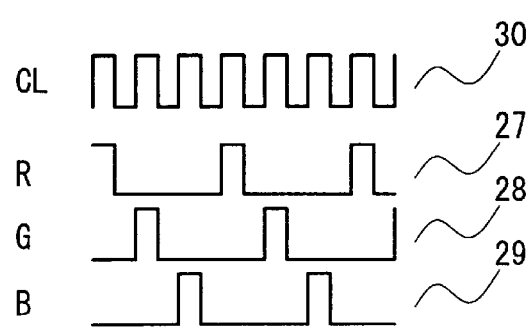
FIG. 4C is a waveform chart showing a waveform for driving the LED light source unit shown in FIG. 4A.

FIG. 4C is a timing chart showing pulse voltages applied to the LEDs 22 to 24 so as to drive the same. The pulse voltages 27 to 29 are synchronized to a clock signal 30 so as to sequentially turn on the LEDs 22 to 24 which emit red, green, and blue light, respectively. The photodetector 25 resets the detected value in response to the clock signal 30. Accordingly, the ratio of voltages sequentially obtained by the photodetector 25 represents the ratio of the light intensities of one color to another color emitted from the LEDs 22 to 24. A control circuit controls an operation of a circuit for driving the LEDs 22 to 24 to be feed-back controlled so as to emit respective colors of lights with the above ratio being kept at a predetermined value.

As stated above, according to this embodiment, when LEDs emitting different colors of light are employed, they are turned on sequentially by color. While, the light intensities thereof are detected with the same timings as the timings of the lighting and feed-back control is conducted according to the detection. As a result, the driving of LEDs emitting different colors can be controlled by only one photodetector.

Note here that, since it is desirable that the light-emission period for each color is set at the minimum duration, the period of the pulse voltage is preferably set at 10 ms or shorter.

Fourth Embodiment

Figure 5A:
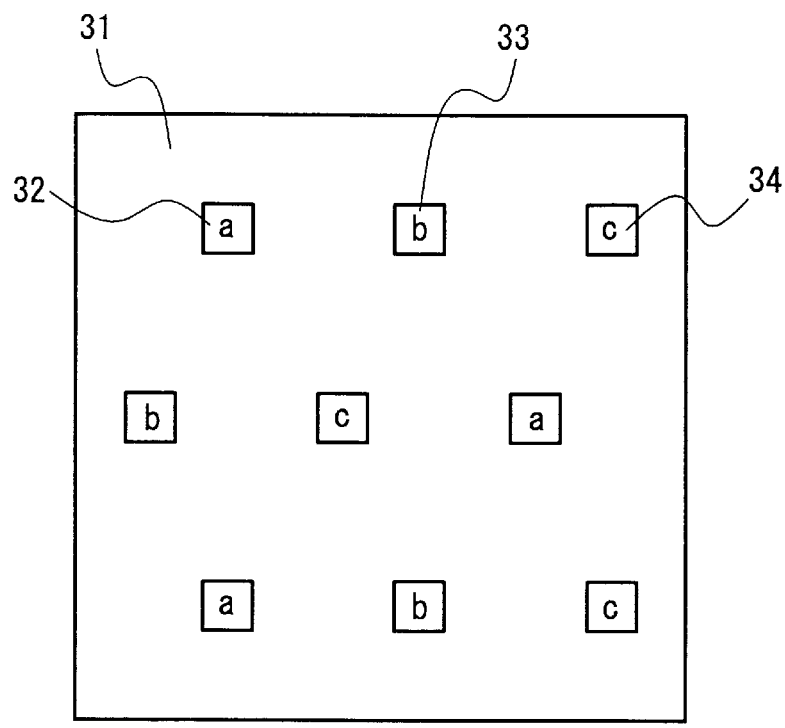
FIG. 5A is a plan view of an LED light source unit in a lighting device according to the fourth embodiment.

FIG. 5A is a plan view of an LED light source unit according to the fourth embodiment of the invention. In this LED light source unit, LEDs are driven in the same manner as in the above third embodiment. However, unlike the third embodiment, the arrangement and the light-emission timing of the LEDs are designed so that a plurality of LEDs located far from one another in the array of LEDs are turned on concurrently.

LEDs 32 to 34 mounted on a substrate 31 are grouped into a, b, and c based on their emitting color of light and wired to one another. With this construction, the LEDs 32 to 34 are turned on by the group. The arrangement of the LEDs 32 to 34 is designed so that LEDs located far from one another are concurrently turned on. This condition would not be always satisfied according to the number of the LEDs used. In such a case, for example, the arrangement is designed so as not to turn on adjacent LEDs concurrently. In other words, a distance between the LEDs concurrently turned on is preferably set longer than the distance between adjacent LEDs in the array.

Figure 5B:
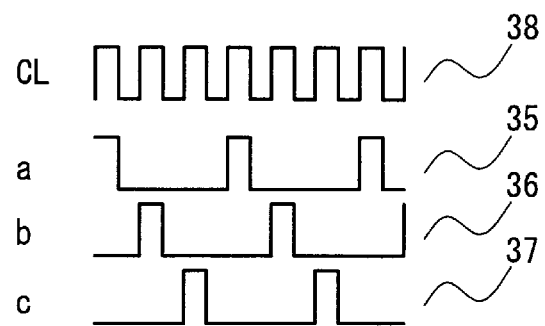
FIG. 5B is a waveform chart showing a waveform for driving the LED light source unit shown in FIG. 5A.

As shown in FIG. 5B, pulse voltages 35, 36, and 37 are applied to the groups a, b, and c, respectively, in synchronization with the clock signal 38, so that a plurality of groups of LEDs are sequentially turned on. Accordingly, the LEDs belonging to the same group and hence located far from one another are concurrently turned on. This construction allows heat generated by the LEDs to be dissipated easily, which minimizes the degradation in the durability and luminous efficiency of LEDs due to temperature rise in the case where LEDs are integrally mounted.

Fifth Embodiment

Figure 6A:
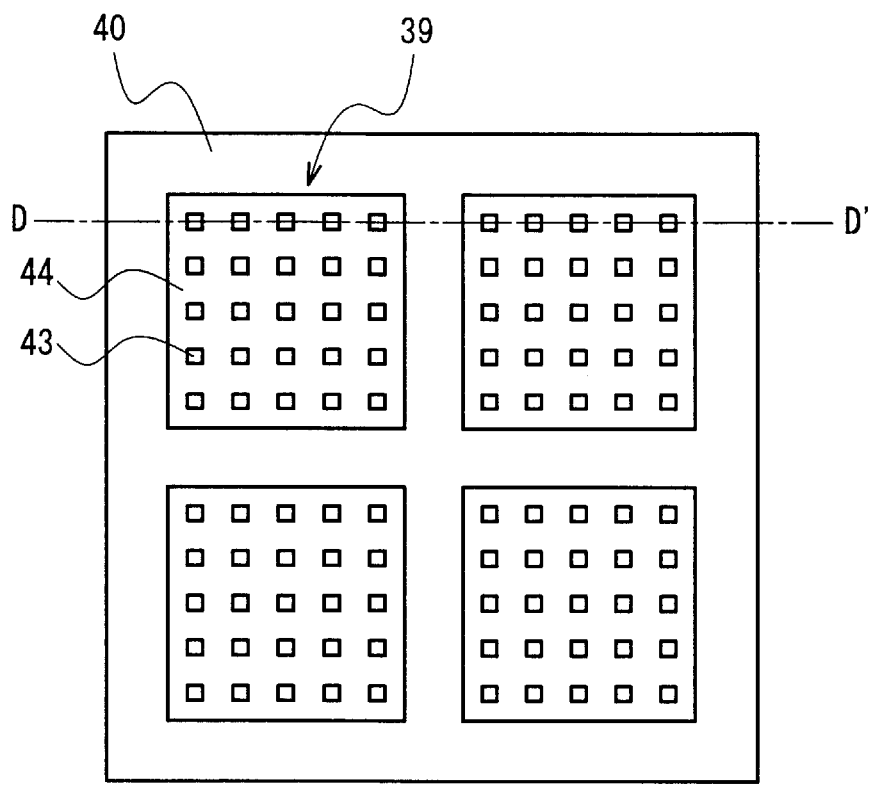
FIG. 6A is a plan view of a lighting device according to the fifth embodiment.
Figure 6B:
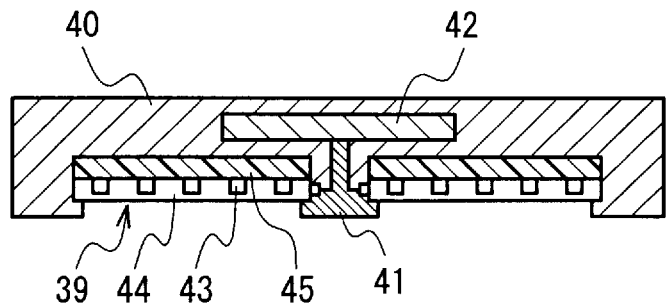
FIG. 6B is a cross-sectional view of the device shown in FIG. 6A.

FIG. 6A is a plan view of a lighting device according to the fifth embodiment of the invention. FIG. 6B is a cross-sectional view taken along the line D–D' in FIG. 6A. This lighting device includes a plurality of lighting units, each of which has a plurality of LEDs covered with the transparent resin layer.

As shown in FIG. 6A, four LED light source units 39 are fixed to a lighting fixture 40. Inside of the lighting fixture 40, a photodetector 41 and a power supply circuit 42 for controlling and driving the LEDs are arranged. Each of the LED light source units 39 has a construction where LEDs 43 are covered with a transparent resin layer 44 and so integrated with a substrate 45. The LED light source units 39 can be installed by fitting in the lighting fixture 40, and also are removable therefrom. Therefore, the LED light source unit 39 are detachable and thus exchangeable. The photodetector 41 is arranged so as to face one end portion of the transparent resin layer 44 of the installed LED light source unit 39. With this construction, the photodetector 41 preferably can detect the light propagated from each of the LEDs 43 through the transparent resin layer 44 like the above-mentioned embodiments.

Each of the LED light source units 39 may include a combination of LEDs 43 emitting different colors of light like the above second through fourth embodiments. Alternatively, like the above first embodiment, LEDs 43 emitting a single color of light may be arranged in one LED light source unit 39, and then a plurality of such LED light source units that emit different colors of light may be combined so as to make up the lighting device according to this embodiment. In any case, however, construction of the photodetector 41 and the power supply circuit 42 has to be adequately selected.

As stated above, according to this embodiment, the plurality of LEDs are mounted on the substrate and covered with the transparent resin layer to construct a unit, and then, a plurality of thus prepared units are arranged on the same plane and turned on, whereby a wide area can be lit up. In addition, since the lighting device includes a plurality of units, should some of the LEDs not work for some reason such as device malfunction, only the failed parts need be exchanged. Further, with the above-stated driving method, if high-efficiency LEDs are developed in the future, such LEDs can be lit up using the same driving circuit and control circuit, irrespective of the size, shape, and driving voltage of LEDs.

Figure 7A:
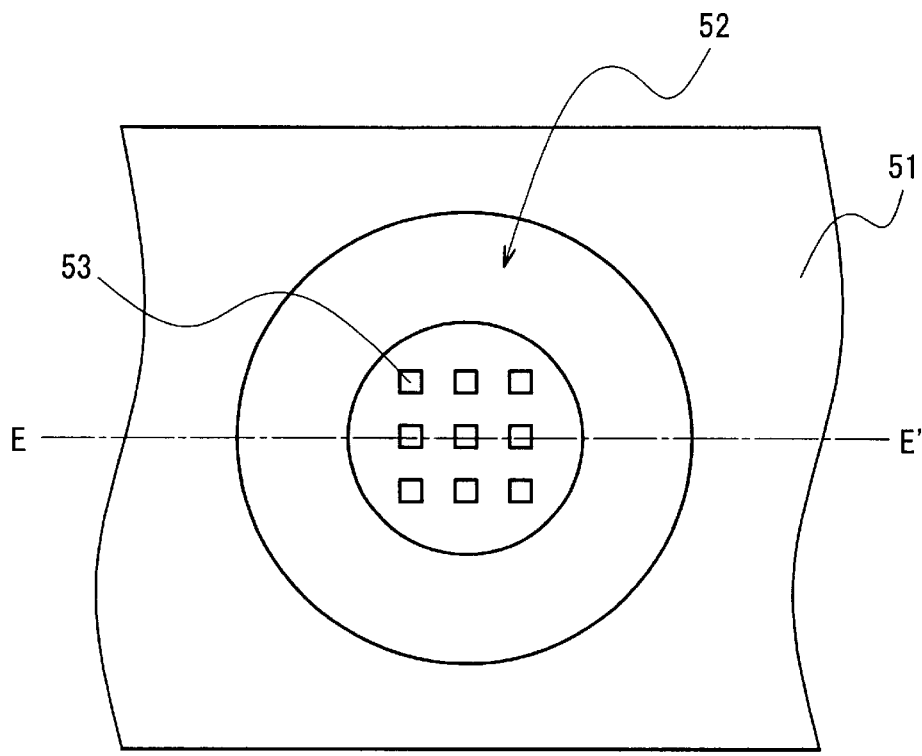
FIG. 7A is a plan view illustrating a part of an LED light source unit in a lighting device according to a modified arrangement of LEDs.
Figure 7B:
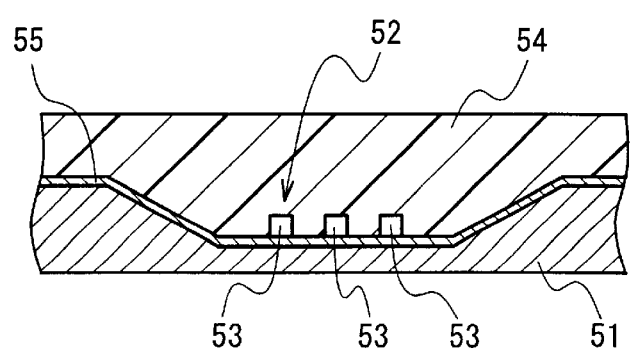
FIG. 7B is a cross-sectional view of the LED light source unit shown in FIG. 7A.

Note here that, if the construction where single LED 8 is mounted in one recess 7a as shown in FIGS. 2A and 2B is replaced with the construction as shown in FIGS. 7A and 7B where a plurality of LEDs 53 are mounted in one recess 52, the same effects as in the above can be obtained. FIG. 7A is a plan view illustrating a part of an LED light source unit. FIG. 7B is a cross-sectional view taken along the line E–E' in FIG. 7A. These figures show a part corresponding to one recess like the recess 7a indicated in FIG. 2A.

In this LED light source unit, a plurality of LEDs 53 (nine LEDs in the illustrated example) are mounted at a bottom face of a recess 52 formed on a surface of a substrate 51 by bare-chip mounting. These LEDs 53 are covered with a transparent resin layer 54 and so integrated into one body. Slightly inclined surfaces are formed by the walls of recess 52 and the surface of the substrate 51 is coated with metal plating 55, so that the walls of the recess constitute a large reflector. A photodetector (not illustrated) is arranged inside, on the surface, or in the vicinity of the transparent resin layer 54.

In this way, with the construction where the plurality of LEDs 53 are mounted in one recess 52, the LED light source unit with directivity can be made considerably thinner. In such a construction, the method for detecting light propagated through the transparent resin layer 54 using a photodetector is especially effective for improving detection accuracy.

This construction may be applied to each of the LEDs 12, 13, and 15 as shown in FIGS. 3A and 3b, which emit red, green, blue lights, respectively. That is, a plurality of LEDs emitting one of the colors may be mounted in the recess 52.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A lighting device comprising:
    a plurality of LEDs that are arranged in an at least two-dimensionally dispersed manner;
    a transparent resin layer that covers the plurality of LEDs in an integrated form;
    a photo-detecting unit using a photodetector that detects an intensity of light emitted from the plurality of LEDs, the photodetector being arranged inside, on a surface, or in the vicinity of the transparent resin layer; and
    a power supply circuit unit that controls driving of the plurality of LEDs based on a detection output from the photo-detecting unit,
    wherein
        the number of the photodetector is smaller than the number of the LEDs, and
        the photodetector detects an intensity of light emitted from the LEDs and propagated through the transparent resin layer.

2. The lighting device according to claim 1, wherein
    the plurality of LEDs are mounted on a surface of a substrate by bare-chip mounting, and
    the plurality of LEDs and the substrate are covered with the transparent resin layer.

3. The lighting device according to claim 2, wherein
    when the top surface of the substrate and the surface of the transparent resin layer are approximately parallel with each other, a thickness h of the transparent resin layer satisfies:

$$h > d/(2 \times \tan(\arcsin(1/n))),$$

where d and n represent a maximum distance between two LEDs out of the plurality of LEDs and a refractive index of the transparent resin layer, respectively.

4. The lighting device according to claim 2, further comprising:
    a recess formed on the surface of the substrate; and
    a metal film applied over the surface of the substrate, wherein
    walls of the recess are inclined so as to form a reflector made of the metal film,
    the plurality of LEDs are mounted on a bottom of the recess, and
    the substrate including the recess is covered with the transparent resin layer.

5. The lighting device according to claim 1, wherein
    the LEDs are composed of a plurality of groups of LEDs, the groups emitting different colors of lights,
    the photo-detecting unit detects an intensity of light emitted from the LEDs as to each color, and
    the control circuit controls the driving of the LEDs so that the LEDs have a predetermined balance of light intensities of the colors according to an output detected as to each color by the photo-detecting unit.

6. The lighting device according to claim 5, wherein
    the photo-detecting unit includes a photo-detecting device for each color, a sensitivity to light of the photo-detecting device conforming with a peak wavelength of a corresponding color of light.

7. The lighting device according to claim 5, wherein
    the plurality of LEDs are sequentially turned on by color, and
    the photo-detecting unit includes a photodetector smaller in number than the colors of lights, the photodetector detecting light in synchronization with the sequential lighting timings, so that the photodetector is shared in detecting the plurality of colors of lights.

8. The lighting device according to claim 5, wherein
    a distance between two LEDs among those emitting the same color of light and concurrently turned on is longer than a distance between adjacent LEDs in an array of the plurality of LEDs.

9. The lighting device according to claim 1, wherein
    an antireflective coating is applied over the surface of the transparent resin layer.

10. The lighting device according to claim 1, wherein
    the photodetector and the plurality of LEDs incorporated integrally in the transparent resin layer and the power supply circuit are mounted on a same substrate.

* * * * *